(12) United States Patent
Morikita et al.

(10) Patent No.: US 7,387,743 B2
(45) Date of Patent: Jun. 17, 2008

(54) ETCHING METHOD AND APPARATUS, COMPUTER PROGRAM AND COMPUTER READABLE STORAGE MEDIUM

(75) Inventors: Shinya Morikita, Hillsboro, OR (US); Atsushi Kawabata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/392,823

(22) Filed: Mar. 30, 2006

(65) Prior Publication Data

US 2006/0219657 A1  Oct. 5, 2006

Related U.S. Application Data

(60) Provisional application No. 60/666,700, filed on Mar. 31, 2005.

(30) Foreign Application Priority Data

Mar. 30, 2005   (JP)   ............................ 2005-097351

(51) Int. Cl.
*B44C 1/22*   (2006.01)
*H01L 21/00*   (2006.01)
(52) U.S. Cl. ............................ 216/79; 216/41; 216/58; 216/67; 438/706; 438/723; 438/725
(58) Field of Classification Search .................. 216/58, 216/67, 79, 41; 438/706, 694, 723, 725
See application file for complete search history.

(56) References Cited

U.S. PATENT DOCUMENTS

2001/0021581 A1*  9/2001  Moon et al. ................. 438/637
2003/0104675 A1*  6/2003  Lim et al. .................... 438/424
2004/0084780 A1*  5/2004  Yew et al. ................... 257/774
2005/0051820 A1*  3/2005  Stojakovic et al. ......... 257/295

* cited by examiner

*Primary Examiner*—Shamim Ahmed
(74) *Attorney, Agent, or Firm*—Oblon, Spivak, McClelland, Maier & Neustadt, P.C.

(57) ABSTRACT

An etching method, for etching a silicon nitride film on an underlying silicon oxide film by using a hard mask whose principal component is a silicon oxide, includes a step of etching the hard mask by using the resist film as a mask to form a mask pattern therein; a step of ashing the resist film; a step of oxidizing the hard mask; a main etching step of etching the silicon nitride film by using the patterned hard mask as a mask; and a step of overetching the silicon nitride film at a high selectivity of the silicon nitride film to the silicon oxide film. The main etching step is performed after the step of forming the mask pattern in the hard mask and before the overetching step at a selectivity of the silicon nitride film to the silicon oxide film smaller than that in the overetching step.

13 Claims, 9 Drawing Sheets

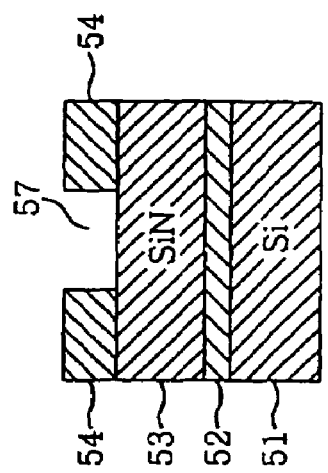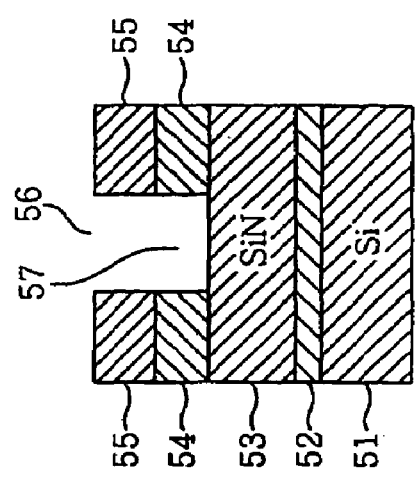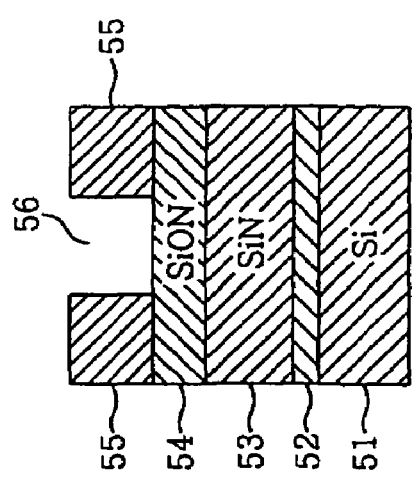

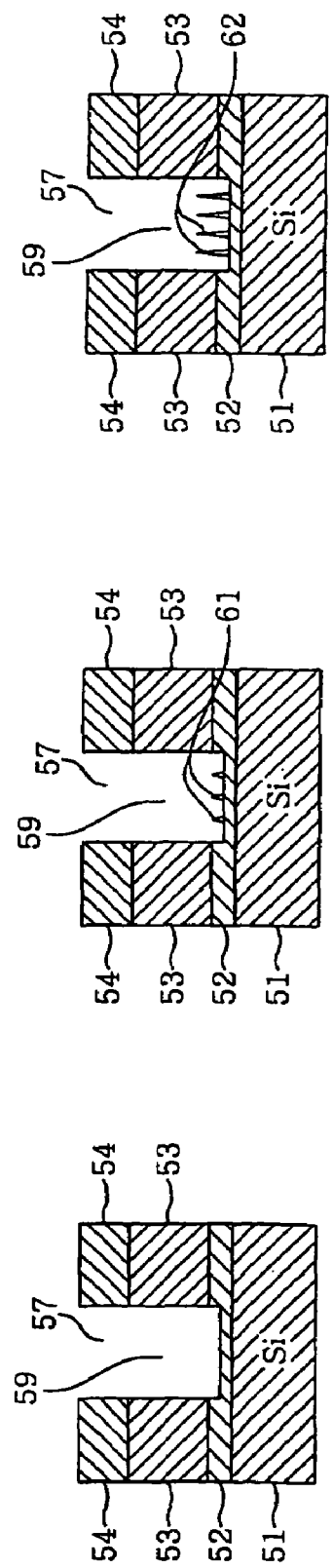

ETCHING METHOD AND APPARATUS, COMPUTER PROGRAM AND COMPUTER READABLE STORAGE MEDIUM

FIELD OF THE INVENTION

The present invention relates to an etching method; and, more particularly, to an etching method and apparatus for etching a silicon nitride film on an underlying silicon oxide film by using a hard mask whose principal component is silicon oxide as a mask, a program for performing the etching method and a computer-readable storage medium storing the program.

BACKGROUND OF THE INVENTION

In order to develop high-integration semiconductor devices with a thinner film structure, the film's kind and structure has been variously studied, and, for example, new CMOS gate structures have been proposed. In a conventional CMOS gate structure, a gate insulating film is formed on a silicon film, and a thinning of the gate insulating film has been progressed. However, a leakage current increases as the gate insulating film becomes thinner, so that the conventional gate structure has a limitation to the thinning thereof.

As one of the new CMOS gate structures, there is, e.g., a so-called three-dimensional gate structure. In such a structure, it is required to form a gate electrode having a fine and three-dimensional shape. Further, in an aspect of a material, a metal gate electrode is under investigation instead of a conventional polycrystalline silicon electrode, and accordingly, considerably complex processes are required in a next-generation semiconductor device manufacturing process.

As one of the processes, a process for etching a silicon nitride (SiN) film on an underlying silicon oxide ($SiO_2$) film has been studied. The patterned silicon nitride film formed by the etching is used in forming the gate electrode later.

However, in general, in case of etching a film, an etching rate of a substrate surface is not completely uniform, and it is difficult to make the etching rates of a central portion and a peripheral portion identical to each other. Accordingly, the etching is continued after the film is etched to expose an underlying film, which is called an overetching. Generally, in case of the overetching, it is required to ensure a high selectivity of the film to the underlying film, but the selectivity of the film to the underlying film is approximately 7 to 10 at most.

However, in a semiconductor device structure being considered herein, the silicon oxide film as the underlying film is very thin, e.g., 5 nm. In this case, a high selectivity of, e.g., about 20 to 40 is required to perform the overetching. Japanese Patent Laid-open Application No. 2003-229418 discloses a method for performing an etching by using, as an etching gas, a gaseous mixture containing $CH_3F$ gas and $O_2$ gas wherein the mixing ratio ($O_2/CH_3F$) of the $O_2$ gas to the $CH_3F$ gas is 4 to 9, in order to increase the selectivity of the silicon nitride film to the silicon oxide film when etching the silicon nitride film by using the silicon oxide film as a mask. Therefore, in the process for etching the silicon nitride film on the underlying silicon oxide film, by using the gaseous mixture upon the overetching, it is possible to etch the silicon nitride film while suppressing the reduction of the underlying film even though the underlying silicon oxide film is thin.

However, in case of using the aforementioned gaseous mixture, there occur problems as described below. FIG. 10A is a view showing a laminated body before etching the above-described silicon nitride film, and in FIG. 10A, reference numerals 11, 12, 13, 14 and 15 denote a silicon (Si) film, a silicon oxide film, a silicon nitride film, a nitrogen containing silicon oxide (SiON) film serving as a hard mask, a resist film and a resist pattern formed in the resist film 15, respectively. In case of performing a conventional etching on such laminated body, the SiON film 14 is etched by using the resist film 15 as a mask, the resist film 15 is removed by ashing, and an etching is then performed with the gaseous mixture described in Japanese Patent Laid-open Application No. 2003-229418 by using the SiON film 14 as a mask.

However, as described above, if an etching is performed by using a gas having a very high selectivity of the silicon nitride film 13 to the silicon oxide film 12, an etching action to the silicon nitride film 13 is strong. At this time, since the silicon nitride film 13 and the SiON film 14 serving as a hard mask have a similar material composition, the gaseous mixture causes local damage to the SiON film 14. Further, because the SiON film 14 is thin, e.g., 50 nm, and the SiON film 14 is not completely uniform even if it has an in-surface uniformity within a specification, holes 18 are formed in the SiON film 14 as confirmed by an experiment. If there occurs such a phenomenon wherein the holes 18 are formed (hereinafter referred to as "pitting"), a surface of the silicon nitride film 13 is damaged through the holes 18, which affects a next process.

It may be considered to protect the SiON film 14 without ashing the resist film 15 to remain when etching the silicon nitride film 13. However, because the gaseous mixture contains a large amount of oxygen, the resist film 15 is ashed when the silicon nitride film is etched. Therefore, in order to protect the SiON film 14, a film thickness of the resist film 15 has to be large. However, in that case, an etching profile is deteriorated. That is, in order to improve the etching profile, the resist film 15 is required to be thin. Under these circumstances, there is demanded an etching method capable of performing the above-described etching without damaging the silicon nitride film.

Further, Japanese Patent Laid-open Application No. 2000-269220 discloses, as a method for forming a hard mask of silicon nitride, a technology capable of thinning a silicon nitride layer by oxidizing an antireflection film on a silicon nitride layer by using an oxygen plasma generated when a resist mask located on the antireflection film is ashed to thereby use the oxidized antireflection film as a protection layer. However, the technology cannot achieve the object of the present invention.

SUMMARY OF THE INVENTION

It is, therefore, an object of the present invention to provide a technology for etching a silicon nitride film at whose bottom a silicon oxide film is located, by using a hard mask whose principal component is silicon oxide as a mask, wherein the silicon nitride film is not damaged.

In accordance with an aspect of the present invention, there is provided an etching method for etching a silicon nitride film in a laminated body wherein the silicon nitride film is laminated on a silicon oxide film and is covered with a hard mask whose principal component is a silicon oxide, and a patterned resist film is formed on the hard mask, the method including: (a) an etching step of etching the hard mask by using the resist film as a mask to form a mask pattern in the hard mask; (b) an ashing step of ashing the resist film; (c) an oxidizing step of oxidizing the surface of the hard mask under a different condition from that in the ashing; (d) a main etching step of etching the silicon nitride film by using the patterned hard mask as a mask; and (e) an overetching step of overetching the silicon nitride film under a selectivity condition of the silicon nitride film to the silicon oxide film that an etching of the silicon oxide film exposed under the silicon nitride film is suppressed, wherein the main etching step (d) is performed after the step (a) and before the overetching step (e) at a selectivity of the silicon nitride film to the silicon oxide film smaller than the selectivity in the overetching step (e). In the present invention, the oxidization of the surface of the hard mask means that a part thereof is oxidized in the thickness direction thereof without being oxidized up to the bottom surface of the hard mask, but does not mean a general surface oxidation where only the surface thereof is oxidized.

Preferably, the main etching step (d) is performed after the ashing step (b) and before the oxidizing step (c) and, more preferably, the main etching step (d) is performed after the step (a) and before the ashing step (b). The oxidizing step (c) may be performed with a plasma generated by plasmarizing oxygen gas, and the overetching step (e) may be performed with a plasma generated by plasmarizing a gaseous mixture of a gas containing carbon, fluorine and hydrogen and oxygen gas.

Preferably, the thicknesses of the hard mask, the silicon oxide film and the silicon nitride film are 50 nm or less, 5 nm or less and 50 nm or larger, respectively.

In accordance with another aspect of the present invention, there is provided an apparatus for performing an etching process on a substrate with a plasma generated by plasmarizing a processing gas, the apparatus including an airtightly sealed processing chamber having therein a mounting table on which the substrate is mounted, a unit for supplying the processing gas into the processing chamber, and a unit for plasmarizing the processing gas in the processing chamber, the apparatus including: a controller for controlling each of the units to execute the etching method described above.

In accordance with still another aspect of the present invention, there is provided a program executed on a computer, the program being used in an apparatus for etching a substrate by introducing a processing gas into a processing chamber, wherein the program is configured to execute the etching method described above. Further, there is provided a computer-readable storage medium storing the program described above.

In accordance with the present invention, in etching the silicon nitride film which is laminated on a silicon oxide film and covered with a hard mask whose principal component is a silicon oxide, after the resist film is ashed, the surface of the hard mask is oxidized in advance under a different condition from that in the ashing and the silicon nitride film is overetched at a high selectivity of the silicon nitride film to the underlying silicon oxide film. Accordingly, an oxidation film formed on the surface of the hard mask serves as a protective layer for the hard mask upon the overetching, so that the damage to the hard mask is suppressed and occurrence of a pitting is prevented. As a result, it is possible to perform the etching in a good state without imparting any damage to the surface of the silicon nitride.

Further, in case the underlying silicon oxide film is a very thin film of, e.g., 5 nm or less and the silicon nitride film to be etched is sufficiently thick compared with the underlying film, it is necessary to set the selectivity of the silicon nitride film to the underlying silicon oxide film at a high level, and by doing so, the etching action to the hard mask becomes increased. In the above point of view, it can be said that the etching method of the present invention is particularly effective in case of a thin hard mask.

BRIEF DESCRIPTION OF THE DRAWINGS

The above and other objects and features of the present invention will become apparent from the following description of preferred embodiment given in conjunction with the accompanying drawings, in which:

FIGS. 2A to 2C show explanatory views showing a process in accordance with a first preferred embodiment of the present invention;

FIGS. 7A to 7C are explanatory views showing states of patterns formed in Examples 1, 2 and the comparative example, respectively;

DETAILED DESCRIPTION OF THE PREFERRED EMBODIMENTS

Figure 1:
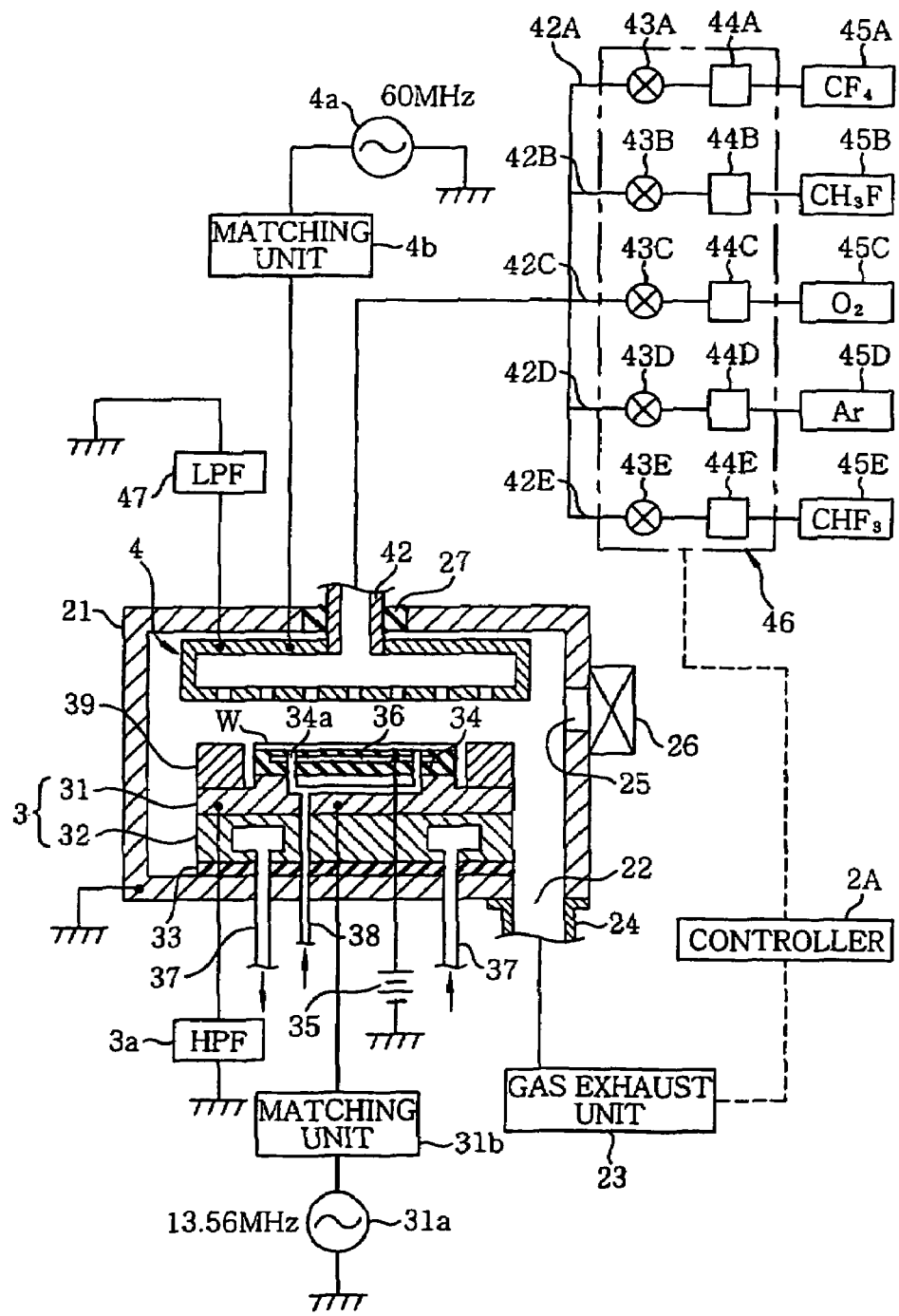
FIG. 1 offers a longitudinal cross-sectional side view showing an example of an etching apparatus employing an etching method of the present invention.

Hereinafter, there will be described preferred embodiments of an etching method in accordance with the present invention, but an example of an etching apparatus used in executing the etching method will be first described with reference to FIG. 1. The etching apparatus shown in FIG. 1 includes, for example, a processing chamber 21 having a sealed inner space whose surface is alumite-treated; a mounting table 3 disposed at a lower central portion in the processing chamber 21; and an upper electrode 4 provided above the mounting table 3 to face it.

The processing chamber 21 is electrically grounded, and a gas exhaust unit 23 is connected via a gas exhaust line 24 to a gas exhaust port 22 formed in the bottom surface of the processing chamber 21. The gas exhaust unit 23 includes a pressure control part (not shown) which receives a control signal from a controller 2A to be described later, the gas exhaust unit 23 controlling the pressure in the processing chamber 21 to be kept at a vacuum level by evacuating the inside of the processing chamber 21 in response to the control signal. In FIG. 1, reference numeral 25 indicates a transfer opening for an object to be processed formed in a sidewall of the processing chamber 21, the transfer opening 25 is closed and opened by a gate valve 26 which is openable/closable.

The mounting table 3 includes a lower electrode 31 and a supporting body 32 supporting the bottom surface of the lower electrode 31, and disposed on a bottom portion of the processing chamber 21 via an insulation member 33. An electrostatic chuck 34 is provided on the mounting table 3, and a wafer W is mounted on the mounting table 3 via the electrostatic chuck 34. The electrostatic chuck 34 is made of an insulating material, and an electrode plate 36 is embedded in the electrostatic chuck 34, the electrode plate 36 being connected to a high voltage DC power supply. The electrostatic chuck 34 electrostatically adsorbs the wafer W by an electrostatic force generated on the surface of the electrostatic chuck 34 by a DC voltage applied from the DC power supply 35 to the electrode plate 36. The electrostatic chuck 34 is provided with through-holes 34a through which a backside gas is discharged toward above of the electrostatic chuck 34.

A coolant path 37 is formed in the mounting table 3, and a predetermined coolant (e.g., a known fluorine-based fluid, a water and the like) flows through the coolant path 37 to cool the mounting table 3 and hence the object mounted on the mounting table 3 to a desired temperature. A temperature sensor (not shown) is installed at the lower electrode 31, temperature of the object on the lower electrode 31 is monitored in all the way by the temperature sensor.

Further, a gas channel 38 is formed in the mounting table 3, and a thermally conductive gas such as He gas is supplied through the gas channel 38 as the backside gas. The gas channel is opened at plural locations on the top surface of the mounting table 3. These opening portions communicate with the through-holes 34a formed in the electrostatic chuck 34, so that the backside gas supplied into the gas channel 38 flows through the through-holes 34a to be discharged toward above of the electrostatic chuck 34. The backside gas is uniformly diffused throughout a gap between the electrostatic chuck 34 and the object mounted thereon, thereby increasing the thermal conductivity in the gap.

The lower electrode 31 is grounded via a high pass filter (HPF) 3a, and a high frequency power supply 31a of, e.g., 13.56 MHz is connected to the lower electrode 31 via a matching unit 31b. A focus ring 39 is disposed on a peripheral portion of the lower electrode 31 to surround the electrostatic chuck 34, so that a generated plasma is focused toward the object on the mounting table 3 by the focus ring 39.

The upper electrode 4 is formed to have an inner space, and the bottom surface thereof is provided with a plurality of holes 41 through which a processing gas is dispersedly supplied into the processing chamber 21 to form a gas shower head. Further, a gas introduction line 42 is connected to a central portion of the top surface of the upper electrode 4, the gas introduction line 42 passing through the central portion of the upper wall of the processing chamber 21 via an insulation member 27. The upstream side of the gas introduction line 42 is divided into five branch lines 42A to 42E ends of which are respectively connected to a $CF_4$ (carbon tetrafluoride) gas supply source 45A, a $CH_3F$ (methyl fluoride) gas supply source 45B, an $O_2$ (oxygen) gas supply source 45C, an Ar (argon) gas supply source 45D and a $CHF_3$ (methane trifluoride) gas supply source 45E. In the respective branch lines 42A to 42E, valves 43A to 43E and mass flow controllers 44A to 44E are installed sequentially toward the upstream side. The valves 43a to 43E and the mass flow controllers 44A to 44E constitute a gas supply system 46, and the gas supply system controls the supplies and the flow rates of the respective processing gases from the gas supply sources 45A to 45E in response to the control signal from the controller 2A to be described later.

The upper electrode 4 is also grounded via a low pass filter (LPF) 47, a high frequency power supply 4a of, e.g., 60 MHz greater than that of the lower electrode 31 is connected to the upper electrode 4 via a matching unit 4b. Although not shown, the high frequency power supplies 4a, 31 are connected to the controller 2A and the powers applied from the high frequency power supplies to the respective electrodes are controlled by the control signals from the controller 2A.

In such an etching apparatus 2, the predetermined processing gases are supplied at predetermined flow rates into the processing chamber 21 from the processing gas supply sources 45A to 45E, respectively, while the processing chamber 21 is evacuated by the gas exhaust unit 23. Under such state, when the high frequency powers are respectively applied to the lower electrode 31 and the upper electrode 4, the processing gases are plasmarized (activated) in the processing chamber 21 by the high frequency power applied to the upper electrode 4 and a bias potential is generated on the wafer W by the high frequency power applied to the lower electrode 31, so that ion species are drawn to the object to increase verticality in the etching pattern. In this way, a desired etching process or oxidizing process is performed on the object mounted on the mounting table 3.

Further, the etching apparatus 2 includes the controller 2A having, e.g., a computer. The controller 2a is provided with a data processing unit having a program, a memory and a CPU. The program has commands by which the controller 2A sends control signals to each part of the etching apparatus 2 to perform each step to form a pattern in the object. Further, the memory is provided with areas wherein parameters such as a processing pressure, a processing time, gas flow rates, powers and the like are recorded. The processing parameters are read out when the CPU executes the commands of the program, and control signals corresponding to the parameters are transmitted to the respective parts of the etching apparatus 2. The program (including a program related to a screen for inputting the processing parameters) is stored in a computer-readable storage medium such as a flexible disc, a compact disc, a MO (magneto-optical disc) and the like and installed into the controller 2A.

Hereinafter, there will be described an etching method in accordance with a first preferred embodiment of the present invention, which employs the etching apparatus 2 described above. First, the gate valve 26 is opened, and a wafer W as a substrate is loaded into the processing chamber 2 by a transfer mechanism (not shown). After the wafer W is horizontally mounted on the mounting table 3, the transfer mechanism is retreated from the processing chamber 21 and the gate valve 26 is closed. Subsequently, a backside gas is supplied from the gas channel 38 to increase the thermal conductivity between the wafer W and the electrostatic chuck 34, thereby cooling the wafer W to a predetermined temperature. Thereafter the following steps are conducted, but the wafer W will be described first. The materials of the films are represented by chemical symbols for the easy correspondence to the drawings. The wafer W is of a laminated structure as shown in FIG. 2A, wherein a $SiO_2$ film 52, a SiN film 53 and a SiON film 54 are laminated on a Si layer 51 and a resist film 55 as an organic film comprised mainly of an organic substance is formed on the SiON film 54. A resist pattern 56 is formed in the resist film 55.

The SiON film 54 functions as a hard mask when the SiN film 53 is etched as will be described later, and also as a bottom antireflection coating when the resist film 55 is exposed in a process of forming the resist pattern 56. The thicknesses of the SiON film 54, the SiN film 53 and the $SiO_2$ film 52 are, e.g., 50 nm or less, 50 nm or greater and 5 nm or less, respectively.

First Embodiment of the Etching Method of the Present Invention (Step 1: Etching of SiON Film 54)

A gaseous mixture of $CHF_3$ gas, $CF_4$ gas and Ar gas whose flow rates are controlled is supplied into the processing chamber 21 while the gas exhaust unit 23 evacuates the inside of the processing chamber 21 through the gas exhaust line 24 to maintain the pressure in the processing chamber 21 to a predetermined level. Subsequently, the high frequency powers from the high frequency power supplies 4a, 31a are respectively applied to the upper electrode 4 and the lower electrode 31 to plasmarize the respective processing gases. In this way, the SiON film 54 is etched in the resist pattern 56 by using the resist film 55 as a mask to form a mask pattern 57, as shown in FIG. 2A.

(Step 2: Ashing of Resist Film 55)

The high frequency power supplies 4a, 31a are set OFF to stop the generation of the plasma and, at the same time, the supply of the $CHF_3$ gas, the $CF_4$ gas and the Ar gas into the processing chamber 21 is stopped. The remaining gas in the processing chamber 21 is exhausted by the gas exhaust unit 23 and $O_2$ gas is then supplied into the processing chamber 21. After the gaseous mixture used at the step 1 in the processing chamber 21 is substituted by the $O_2$ gas, the $O_2$ gas is plasmarized by applying the predetermined high frequency powers to the upper electrode 4 and the lower electrode, respectively. With this plasmarization, the resist film 55 remaining on the SiON film 54 is ashed to be removed (FIG. 2C). In this ashing process, the flow rate of the $O_2$ gas is 300 sccm and the powers applied to the upper and the lower electrode 4 and 31 are 300 W and 100 W, respectively, for example.

(Step 3 Forming of Precursory Pattern 58)

The high frequency power supplies 4a, 31a are set OFF to stop the generation of the plasma and, at the same time, the supply of the $O_2$ gas. The remaining $O_2$ gas in the processing chamber 21 is exhausted and the $CHF_3$ gas, the $CF_4$ gas and the Ar gas are supplied into the processing chamber 21 at respective controlled flow rates. After the $O_2$ gas is substituted by the gaseous mixture of the $CHF_3$ gas, the $CF_4$ gas and the Ar gas, the gaseous mixture is plasmarized by applying the predetermined high frequency powers to the upper electrode 4 and the lower electrode, respectively. With this plasmarization, a main etching of the SiN film 53 is conducted by using the SiON film 54 as a mask to form a precursory pattern 58 of the SiN film 53. In this etching process, in order to secure a vertical shape and suppress any damage to the SiON film 54, the etching is conducted under the condition of the selectivity of the SiN film 53 to the $SiO_2$ film 52 (etching rate of the SiN film 53/etching rate of the $SiO_2$ film 52) of, e.g., 1 to 3.

Further, in the step 3, since the $CF_4$ gas as a CF-based gas is used as a part of the processing gases, the etching is performed while polymer components are attached to sidewalls of the precursory pattern 58 as a protective film due to active species of the $CF_4$ gas. Therefore, the sidewalls of the precursory pattern 58 are formed with a high verticality, so that the shape of a finally formed pattern 59 is controlled to form recesses with a high verticality.

In the step 3, in order to prevent the $SiO_2$ film 52 from being etched, the main etching process is stopped in the state that the bottom of the precursory pattern 58 remains in the SiN film 53, i.e., the main etching process is stopped immediately before the $SiO_2$ film 52, which is the underlying film of the SiN film 53, is exposed throughout the entire surface of the wafer W.

The overetching, in step 5 which will be described later, is conducted under a higher selectivity of the SiN film 53 to the $SiO_2$ film 52 than that in the step 3, so that the sidewall protective function of the pattern during the etching cannot be expected compared with the step 3. Further, as the time period of the overetching conducted in the step 5 becomes longer, the damage to the SiON film 53 becomes greater. In this connection, it is preferable to form the precursory pattern 58 up to a deeper location in the SiN film 53. Further, in consideration of the difference of the etching rate in surface, it is preferable to form the precursory pattern 58 up to, e.g., a depth corresponding to 85% of the thickness of the SiN film 53 on average.

(Step 4: Oxidization of SiON Film 54)

The high frequency power supplies 4a, 31a are set OFF to stop the generation of the plasma and, at the same time, the supply of the $CHF_3$ gas, the $CF_4$ gas and the Ar gas into the processing chamber 21 is stopped. The remaining gas in the processing chamber 21 is exhausted by the gas exhaust unit 23 and $O_2$ gas is then supplied into the processing chamber 21. After the gaseous mixture used at the step 1 in the processing chamber 21 is substituted by the $O_2$ gas, the $O_2$ gas is plasmarized by applying the predetermined high frequency powers to the upper electrode 4 and the lower electrode, respectively, to thereby oxidize the SiON film 54. In this oxidizing process, the flow rate of the $O_2$ gas is 1200 sccm and the powers applied to the upper and the lower electrode 4 and 31 are 300-1500 W and 50-200 W, respectively, for example, and the oxidizing process is conducted under different conditions from those in the ashing process in the step 2.

Figure 3A:
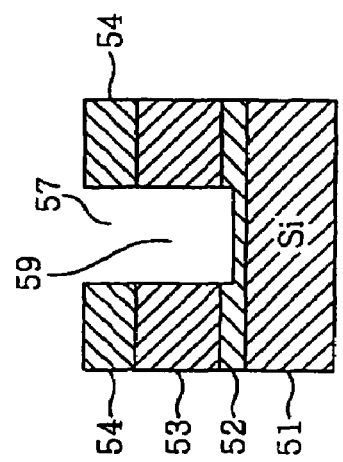
FIGS. 3A to 3C are explanatory views showing the process in accordance with the first preferred embodiment of the present invention.
Figure 3B:
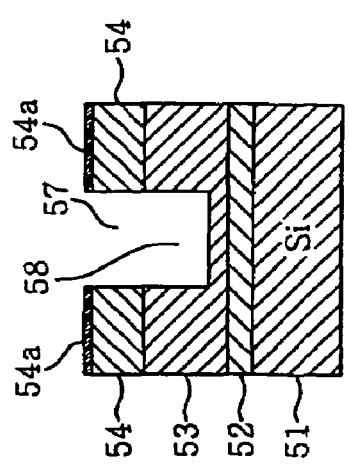
Figure 3C:
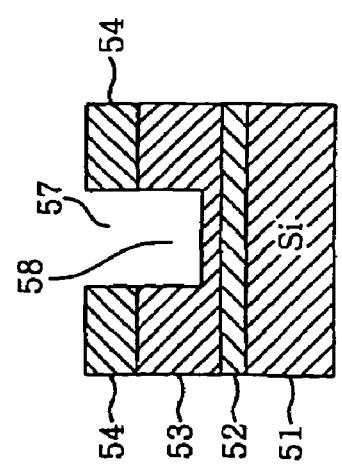

FIG. 3B shows the wafer W after the completion of the oxidization, wherein the surface of the SiON film 54 is oxidized by the plasma processing with the $O_2$ gas. Reference numeral 54a is an oxidization layer formed by oxidizing the SiON film 54. The step 4 is conducted so as to enhance the selectivity of the SiN film 53 to the SiON film 54 upon the overetching in the step 5, i.e., to protect the SiON film 54 by increasing the resistance of the SiON film 54 upon the overetching. In the step 4, it is preferable that one to several tens of atom layers of the surface of the SiON film 54 are oxidized. If the oxidizing process is excessively conducted, the surface oxidization of the precursory pattern 58 is progressed, so that the etching at the step 5 may not be normally conducted, which would affect the formation of the pattern 59.

(Step 5: Formation of Pattern 59)

The high frequency power supplies 4a, 31a are set OFF to stop the generation of the plasma. Further, the remaining gas in the processing chamber 21 is exhausted and the $O_2$ gas, the $CHF_3$ gas and the Ar gas are supplied into the processing chamber 21 at respective controlled flow rates. After the remaining gas in the processing chamber 21 is substituted by the gaseous mixture of the above processing gases, the gaseous mixture is plasmarized by applying the predetermined high frequency powers to the upper electrode 4 and the lower electrode, respectively. In this way, the SiN film 53 remaining in the main etching process at the step 3 is etched to form the pattern 59 by etching (overetching) the SiO$_2$ film 52 only for a time period during which the SiN film 53 is surely removed throughout the entire surface.

In this step 5, in order to suppress the SiO$_2$ film 52 from being etched, the reaction is conducted under a higher selectivity of the SiN film 53 to the SiO$_2$ film 52 than that in the step 3. Specifically, the etching is conducted under the condition that the processing gases are supplied into the processing chamber 21 at a ratio of the CH$_3$F gas to the O$_2$ gas of 4 to 9 and the selectivity becomes, e.g., 20 or greater.

In the etching method of the first embodiment as described above, the main etching is conducted on the SiN film 53 by using the SiON film 54 as the hard mask immediately before the underlying SiO$_2$ film 52 is exposed to thereby form the precursory pattern 58, the surface of the SiON film 54 is oxidized, and the overetching is conducted to etch the remaining portion of the SiN film 53 to expose the SiO$_2$ film 52. The overetching process is conducted under a high selectivity of the SiN film 53 to the SiO$_2$ film 52 since the underlying SiO$_2$ film 52 is extremely thin, so that a large etching action is exerted on the SiON film 54 as the hard mask whose components are similar to those of the SiN film 53. However, the SiON film 54 is oxidized to have a protective film formed thereon, and the most of the SiN film 53 is removed by the main etching to make the overetching time shorten; and, therefore, the damage to the SiON film 54 upon the overetching is suppressed and the generation of pitting is prevented. As a result, it is possible to suppress the damage to the surface of the SiN film 53. Accordingly, the pattern 59 can be formed in a good state with respect to the laminated structure with the thin resist film 55.

Further, although there is used, as the hard mask upon the etching of the SiN film, a film whose principal component is a silicon oxide, e.g., the SiON film in this embodiment, the present invention is not limited to the SiON film and a SiOC film or a SiCOH film may be used as the hard mask.

Second Embodiment of the Etching Method of the Present Invention

Figure 4A:
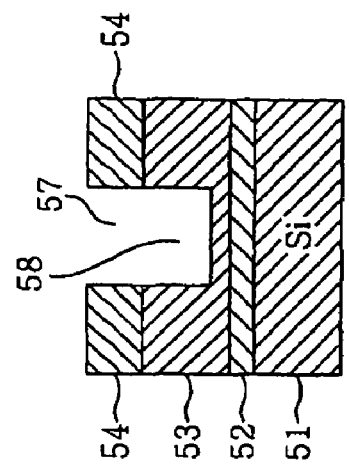
FIGS. 4A to 4C depict explanatory views showing a process in accordance with a second preferred embodiment of the present invention.
Figure 4B:
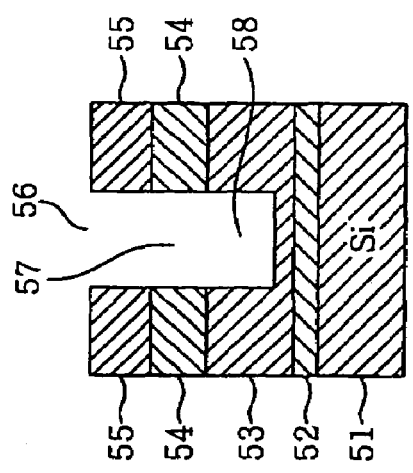

Hereinafter, a second preferred embodiment of the present invention will be described with reference to FIGS. 4A and 5B. First, as shown in FIG. 4A, a wafer W having the same laminated structure as in the first embodiment is loaded into te processing chamber 21, and a gaseous mixture of CHF$_3$ gas, CF$_4$ gas and Ar gas is supplied into the processing chamber 21. An etching of the SiON film 54 and a main etching of the SiN film 53 are conducted by using the resist film 55 as a mask as shown in FIG. 4B to form the mask pattern 57 and the precursory pattern 58. The main etching is stopped immediately before the SiO$_2$ film is exposed as similarly to the step 3 in the first embodiment and, therefore, the bottom of the precursory pattern 58 lies in the SiN film 53.

Figure 4C:
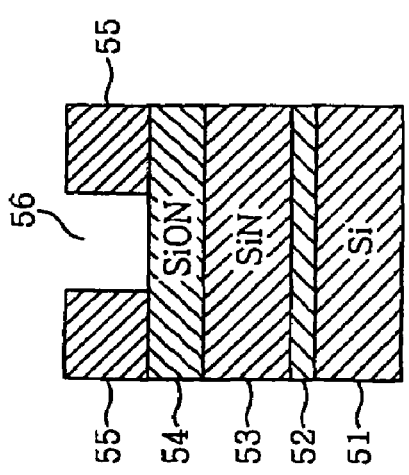
Figure 5A:
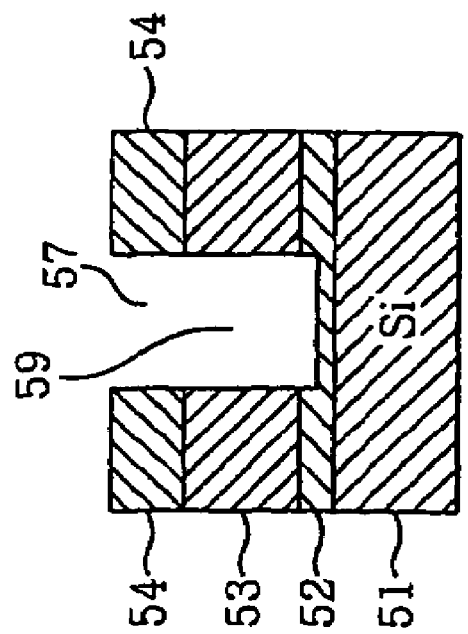
FIGS. 5A and 5B are explanatory views showing the process in accordance with the first preferred embodiment of the present invention.
Figure 5B:
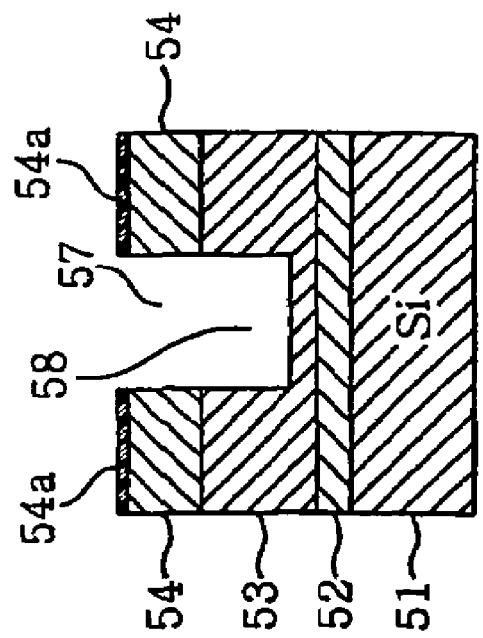

Subsequently, the ashing removal of the remaining resist film 55 is performed as similarly to the step 2 in the first embodiment (FIG. 4C), the surface of the SiON film 54 is oxidized to form the oxidization layer 54a as similarly to the step 4 of the first embodiment (FIG. 5A), and the remaining SiN film 53 in the precursory pattern 58 is overetched up to reach the SiO$_2$ film 52 to form the pattern 59 as similarly to the step 5 of the first embodiment (FIG. 5B).

In this embodiment, since the surface of the SiON film 54 as the hard mask is oxidized before the overetching, the damage to the SiON film 54 upon the overetching is suppressed and the generation of the pitting in the SiON film 54 is prevented. Therefore, there can be obtained the same effects as those in the first embodiment.

Further, alternatively, the steps 4 and 3 in the first embodiment may be exchanged. That is, after the resist film 55 on the SiON film 54 is removed by the ashing as shown in FIG. 2C, the surface of the SiON film 54 is oxidized as described above and the main etching is then conducted thereon.

EXAMPLES

Example 1

In Example 1, the pattern 59 was formed on a wafer W having the laminated structure as described in the aforementioned embodiments in accordance with the steps in the first embodiment by using the above-described etching apparatus 2. In Example 1, the conditions in each step are as follows:
(Step 1: Etching of the SiON Film 54)
Pressure of the gaseous mixture: 20-50 mTorr (2.67-6.67 Pa)
Powers of the high frequency power supplies (U/L): 300-600 W/0-400 W (where, U and L represent the upper and the lower electrode, respectively)
Flow rate ratio of the gaseous mixture: CHF$_3$/CF$_4$/Ar=0-200/200-400/600 sccm
(Step 2: Ashing of the Resist Film 55)
Pressure of the O$_2$ gas: 200 mTorr (26.7 Pa)
Powers of the high frequency power supplies (U/L): 300 W/100 w
Flow rate of the O$_2$ gas: 300 sccm
(Step 3: Formation of Precursory Pattern 58)
Pressure of the gaseous mixture: 20-50 mTorr (2.67-6.67 Pa)
Powers of the high frequency power supplies (U/L): 300-600 W/0-400 W
Flow rate ratio of the gaseous mixture: CHF$_3$/CF$_4$/Ar=0-200/200-400/600 sccm
(Step 4: Oxidization of the SiON Film 54)
Pressure of the O$_2$ gas: 200 mTorr (26.7 Pa)
Powers of the high frequency power supplies (U/L): 300-1500 W/50-200 W
Flow rate of the O$_2$ gas: 1200 sccm
(Step 5: Formation of the Pattern 59)
Pressure of the gaseous mixture: 120 mTorr (16.0 Pa)
Powers of the high frequency power supplies (U/L): 500 W/100-300 W
Flow rate ratio of the gaseous mixture: CHF$_3$/O$_2$/Ar=3/13/90 sccm Example 2

In Example 1, the pattern 59 was formed on a wafer W having the same structure as that of the wafer W used in Example 1 in accordance with the steps in the second embodiment by using the above-described etching apparatus 2. In Example 2, the first process of etching the SiON film 54 and the SiN film 53 by using the resist film 55 as the mask was conducted under the following conditions:
Pressure of the gaseous mixture: 20-50 mTorr (2.67-6.67 Pa)
Powers of the high frequency power supplies (U/L): 300-600 W/0-400 W
Flow rate ratio of the gaseous mixture: CHF$_3$/CF$_4$/Ar=0-200/200-400/600 sccm The ashing process of the resist film 55, the oxidizing process of the SiON film 54 and the overetching process of SiN film 53, which are subsequent to the above first process, were sequentially conducted under the same reaction conditions as those in the steps 2, 4 and 5 in Example 1, respectively.

Comparative Example

Figure 6A:
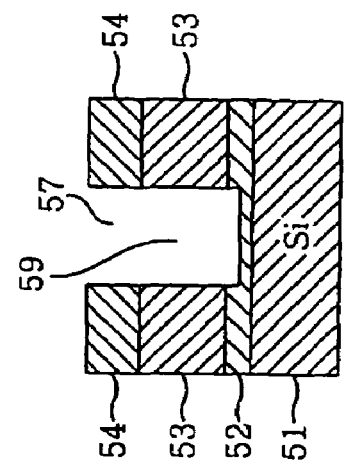
FIGS. 6A to 6C offer explanatory views showing a process in a comparative example.
Figure 6B:
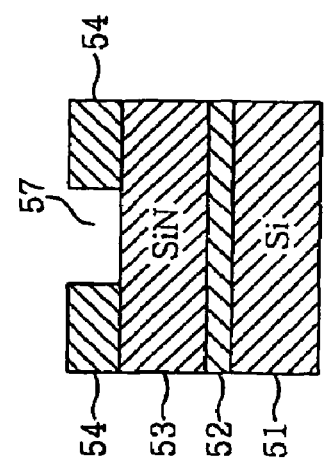
Figure 6C:
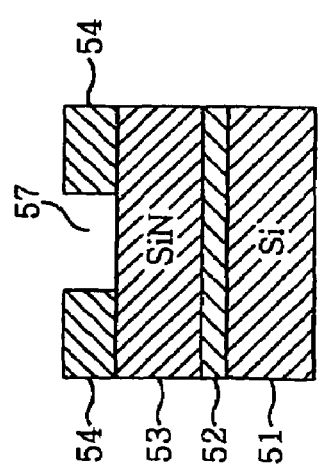

In the comparative example, the etching process was performed on a wafer W having the same structure as that of the wafer used in Examples 1 and 2, as shown in FIGS. 6A to 6C. That is, in the same way as that shown in FIG. 2 of the first embodiment, the SiON film 54 is etched and the resist film 55 is then ashed (FIG. 6A). Subsequently, the SiON film 54 is oxidized in the same way as that shown in FIG. 3B, and a so-called high selectivity etching is performed on the SiN film 53 under the overetching conditions, so that the SiN film 53 is removed to form the pattern 59 (FIG. 6C). The reaction conditions of each step in the comparative example were identical to those of each step in Example 1.

FIGS. 7A to 7C and 8 schematically show the patterns 59 formed in Examples 1, 2 and the comparative example. The schematic diagrams were illustrated based on the results of observing the surfaces of the processed wafers by using a scanning electron microscope. FIG. 7A corresponds to Example 1, wherein the sidewall of the pattern 59 was formed substantially vertically. FIG. 7B corresponds to Example 2, wherein there were observed some residuals 61 of the resist scattered on the bottom of the pattern 59 formed, but the amount of residuals 61 was not problematic. Further, in Example 2, the sidewall of the pattern 59 was formed substantially vertically. FIG. 7C corresponds to the comparative example, wherein the pattern 59 was formed in a taper shape and large residuals 62 such as a frog were present on the bottom of the pattern 59. It is believed that the sidewall of the pattern 59 was formed in the taper shape since the pattern 59 was formed under the condition of obtaining a high selectivity for the $SiO_2$ film 52 without forming the precursory pattern 58 and the protective action of the polymer attachment for the sidewall was weaker than in Examples 1 and 2. Further, it is believed that the residuals 62 appeared since, when the SiON film 54 was oxidized, the surface of the SiN film 53, which was exposed along with the SiON film 54, was also oxidized and the oxidized portion became a thin mask to deteriorate the etching of the SiN film 53 in the etching under the high selectivity condition, thereby resulting in the residuals. Consequently, as can be seen from Examples 1, 2 and the comparative example, in accordance with the etching method of the present invention, the sidewall of the pattern 59 can be formed substantially vertically and the occurrence of the residuals can be suppressed.

Figure 8:
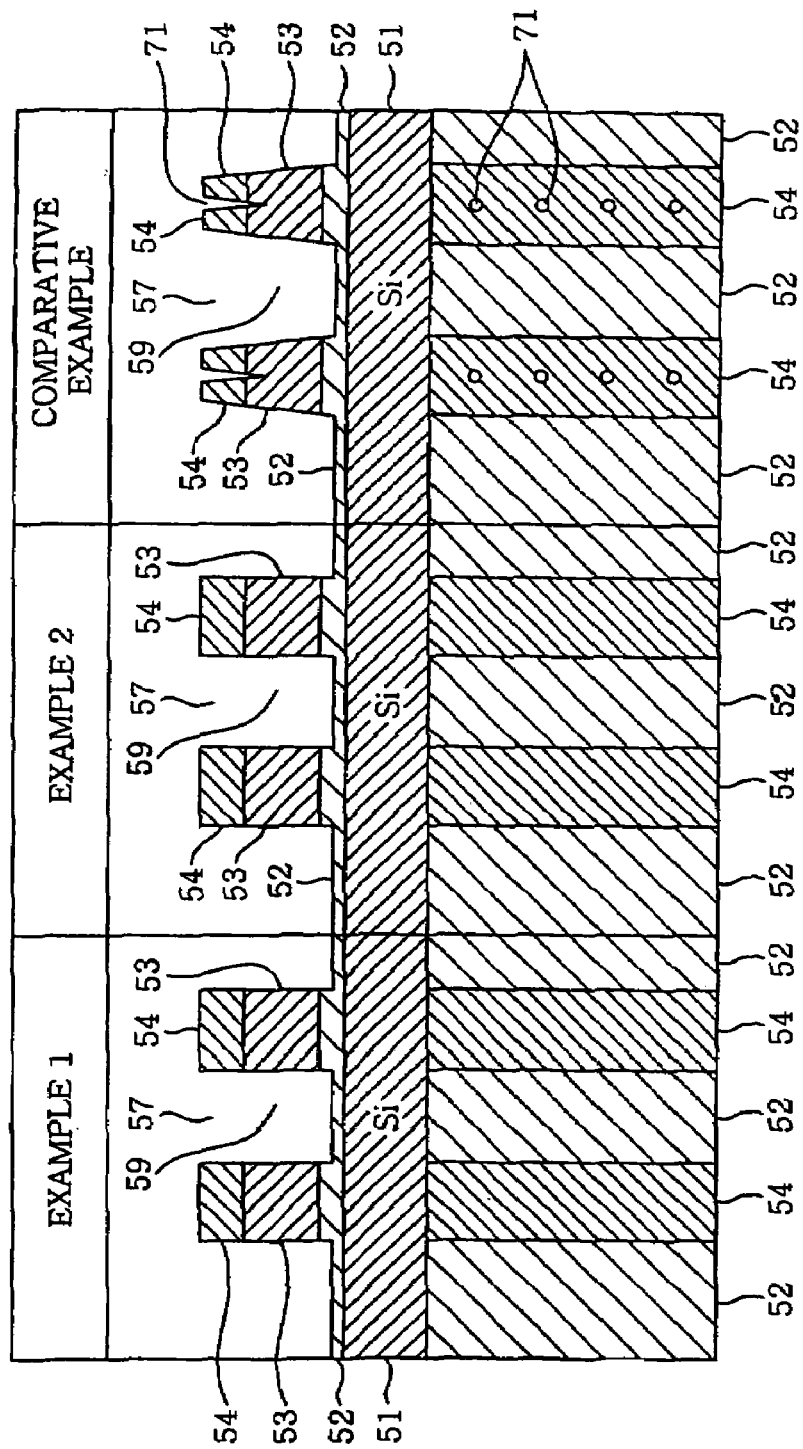
FIG. 8 is an explanatory view showing the states of the patterns formed in Examples 1, 2 and the comparative example, respectively.

Furthermore, FIG. 8 shows a cross-sectional side view and a top view of the pattern in Examples 1, 2 and the comparative example at the upper and the lower section, respectively. In Examples 1 and 2, no pitting appeared in the SiON film 54, whereas the pitting appeared in the comparative example so that holes 71 are formed to extend through the SiON film 54 to reach the SiN film 53 as shown in FIG. 8. It is believed that this is because the precursory pattern 58 was not formed in the comparative example and the time period of the etching performed under the high selectivity condition for the SiN film 53 was longer than in Examples 1 and 2, thereby resulting in an increased damage to the SiON film 54. Consequently, it has been proved from Examples 1, 2 and the comparative example that the etching method of the present invention is effective for suppressing the damage exerted to the SiON film 54 and preventing the occurrence of the pitting.

Subsequently, with respect to the oxidizing process of the SiON film 54 in the process of forming the pattern 59, there was executed a test for verifying the relationship between the powers applied to the upper electrode 4 and the lower electrode 31 and the pattern formed by oxidizing the SiON film 54 while varying the powers. As the sequence of forming the pattern 59 in this verifying test, there were executed the substantially same steps as those in Example 1, but the process of etching the SiON film 54 to form the mask pattern 57 was executed in two stages. Specifically, an etching was first executed under a low selectivity condition for the SiN film 53 by using the resist film 55 as a mask and an overetching was then executed under a high selectivity condition for the SiN film 53 by using the resist film 55 as a mask. Thereafter, the reactions were progressed in the same steps 2 to 5 as those in the embodiment described above and an ashing was again executed for removing a small amount of the attached polymer due to the etching after the step 5 had been completed.

Although there has been employed, as the etching apparatus for etching the SiON film 54 under the high selectivity condition, the etching apparatus having the substantially same configuration as that of the etching apparatus 2 described above, the corresponding etching apparatus includes, as the processing gas supply source, an additional gas supply source for $C_4F_8$ (octafluorocyclobutane) gas as a CF-based gas besides the gas supply sources 45A to 45E provided in the etching apparatus 2, and is configured to supply the $C_4F_8$ gas at a predetermined flow rate into the processing chamber 21 through a mass flow controller and a valve as similarly to the other processing gases.

The reaction conditions in each step are as follows:

The first step (the step of etching the SiON film 54 under a low selectivity condition for the SiN film 53)

Pressure of the gaseous mixture: 20-50 mTorr (2.67-6.67 Pa)

Powers of the high frequency power supplies (U/L): 300-600 W/0-400 W

Flow rate ratio of the gaseous mixture: $CHF_3/CF_4/Ar$=0-200/200-400/600 sccm

The second step (the step of etching the SiON film 54 under a high selectivity condition for the SiN film 53)

Pressure of the gaseous mixture: 50-100 mTorr (6.67-13.3 Pa)

Powers of the high frequency power supplies (U/L): 100 W/500 W

Flow rate ratio of the gaseous mixture: $C_4F_8/Ar/O_2$=0-50/800/0-50 sccm

The third step (corresponding to the step 3 in the first embodiment)

Pressure of the $O_2$ gas: 200 mTorr (26.7 Pa)

Powers of the high frequency power supplies (U/L): 300 W/100 w

Flow rate of the $O_2$ gas: 300 sccm

The fourth step (corresponding to the step 3 in the first embodiment)

Pressure of the gaseous mixture: 20-50 mTorr (2.67-6.67 Pa)

Powers of the high frequency power supplies (U/L): 300-600 W/0-400 W

Flow rate ratio of the gaseous mixture: $CHF_3/CF_4/Ar$=0-200/200-400/600 sccm

The fifth step (corresponding to the step 4 in the first embodiment)

Figure 9:
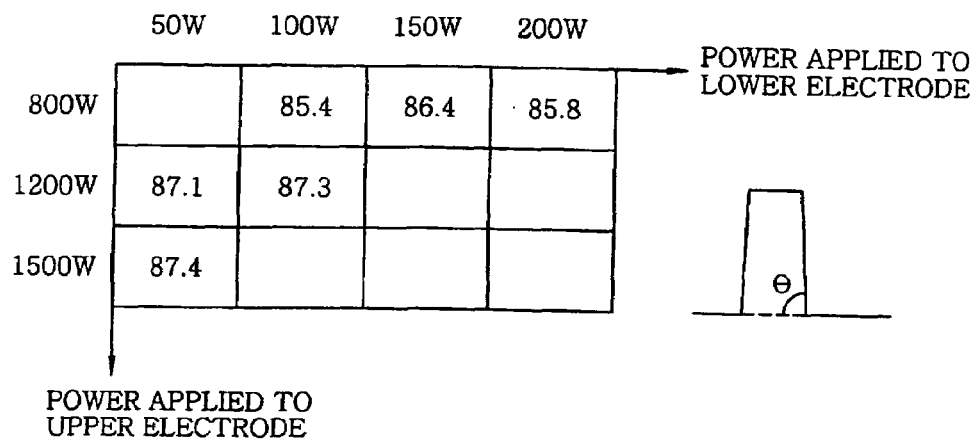
FIG. 9 is a table indicating results of a test for verifying a shape of the pattern and powers applied to electrodes in the etching apparatus.
Figure 10A:
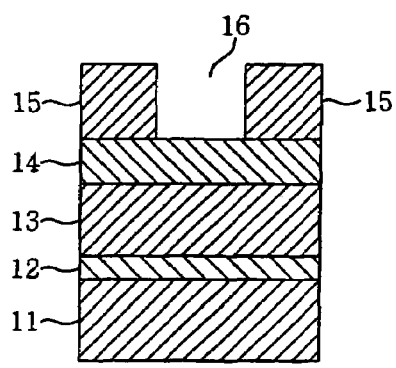
FIGS. 10A and 10B are cross-sectional views of patterns formed in accordance with a conventional etching method.
Figure 10B:
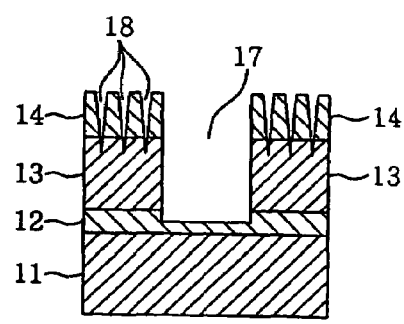

Pressure of the O₂ gas: 200 mTorr (26.7 Pa)
Powers of the high frequency power supplies (U/L): 300-1500 W/50-200 W
Flow rate of the O₂ gas: 1200 sccm
The sixth step (corresponding to the step 5 in the first embodiment)
Pressure of the gaseous mixture: 120 mTorr (16.0 Pa)
Powers of the high frequency power supplies (U/L): 500 W/100-300 W
Flow rate ratio of the gaseous mixture: CHF₃/O₂/Ar=3/13/90 sccm
The seventh step (the step of removing a small amount of polymer attached due to the etching)
Pressure of the O₂ gas: 200 mTorr (26.7 Pa)
Powers of the high frequency power supplies (U/L): 300 W/100 w
Flow rate of the O₂ gas: 1200 sccm FIG. 9 shows the results of the above steps. In FIG. 9, the vertical and the horizontal axes of the left table represent the powers applied to the upper and the lower electrode 4 and 31 in the fifth step, respectively, and the numbers in the table indicate θ shown in the right of the FIG. 9, i.e., the angle of the sidewall of the pattern 59 formed to the horizontal plane. As can be seen from FIG. 9, as the power applied to the lower electrode 31 is decreased compared with the power applied to the upper electrode 4 to reduce the attraction of O₂ plasma toward the precursory pattern 58, θ becomes closer to 90°, thereby resulting in a good pattern shape.

While the invention has been shown and described with respect to the preferred embodiment, it will be understood by those skilled in the art that various changes and modifications may be made without departing from the scope of the invention as defined in the following claims.

What is claimed is:

1. An etching method for etching a silicon nitride film in a laminated body wherein the silicon nitride film is laminated on a silicon oxide film and is covered with a hard mask whose principal component is a silicon oxide, and a patterned resist film is formed on the hard mask, the method comprising:
   (a) an etching step of etching the hard mask by using the resist film as a mask to form a mask pattern in the hard mask;
   (b) an ashing step of ashing the resist film;
   (c) an oxidizing step of oxidizing the surface of the hard mask under a different condition from that in the ashing;
   (d) a main etching step of etching the silicon nitride film by using the patterned hard mask as a mask; and
   (e) an overetching step of overetching the silicon nitride film under a selectivity condition of the silicon nitride film to the silicon oxide film that an etching of the silicon oxide film exposed under the silicon nitride film is suppressed,
   wherein the main etching step (d) is performed after the step (a) and before the overetching step (e) at a selectivity of the silicon nitride film to the silicon oxide film smaller than the selectivity in the overetching step (e).

2. The etching method of claim 1, wherein the main etching step (d) is performed after the ashing step (b) and before the oxidizing step (c).

3. The etching method of claim 1, wherein the main etching step (d) is performed after the step (a) and before the ashing step (b).

4. The etching method of claim 1, wherein the oxidizing step (c) is performed with a plasma generated by plasmarizing oxygen gas.

5. The etching method of claim 1, wherein the overetching step (e) is performed with a plasma generated by plasmarizing a gaseous mixture of a gas containing carbon, fluorine and hydrogen and oxygen gas.

6. The etching method of claim 1, wherein the thickness of the hard mask is 50 nm or less.

7. The etching method of claim 1, wherein the thickness of the silicon oxide film is 5 nm or less.

8. The etching method of claim 1, wherein the thickness of the silicon nitride film is 50 nm or larger.

9. The etching method of claim 1, wherein the hard mask is formed of nitrogen containing silicon oxide.

10. The etching method of claim 1, wherein the main etching step (d) is stopped immediately before the silicon oxide film is exposed.

11. The etching method of claim 1, wherein the selectivity in the overetching step (e) is 20 or greater.

12. The etching method of claim 1, wherein the main etching step (d) is performed after the oxidizing step (c).

13. The etching method of claim 1, wherein oxygen gas is supplied in the ashing step (b) and the oxidizing step (c), a flow rate of the oxygen gas in the oxidizing step (c) being greater than that in the ashing step (b).

* * * * *